United States Patent
Choi et al.

(10) Patent No.: US 7,858,483 B2
(45) Date of Patent: Dec. 28, 2010

(54) METHOD FOR FABRICATING CAPACITOR OF SEMICONDUCTOR DEVICE

(75) Inventors: Hyung Bok Choi, Yongin-si (KR); Jong Bum Park, Icheon-si (KR); Kee Jeung Lee, Seoul (KR); Jong Min Lee, Suwon-Si (KR)

(73) Assignee: Hynix Semiconductor Inc., Icheon-si (KR)

(*) Notice: Subject to any disclaimer, the term of this patent is extended or adjusted under 35 U.S.C. 154(b) by 908 days.

(21) Appl. No.: 11/154,384

(22) Filed: Jun. 15, 2005

(65) Prior Publication Data
US 2006/0134855 A1    Jun. 22, 2006

(30) Foreign Application Priority Data
Dec. 17, 2004    (KR)    ............... 10-2004-0107935

(51) Int. Cl.
*H01L 21/20*    (2006.01)

(52) U.S. Cl. .............. 438/381; 438/629; 438/637; 438/638; 438/639; 438/640; 438/668; 438/672; 438/675; 438/701; 438/702; 438/254; 438/255; 438/397; 257/E21.649

(58) Field of Classification Search .......... 438/254, 438/255, 381, 397, 629, 637, 638, 639, 640, 438/668, 672, 675, 701, 702; 257/304, 311, 257/E21.649
See application file for complete search history.

(56) References Cited

U.S. PATENT DOCUMENTS

| | | | | |
|---|---|---|---|---|
| 5,381,302 A * | 1/1995 | Sandhu et al. | ............... | 361/305 |
| 5,470,790 A * | 11/1995 | Myers et al. | ............... | 438/625 |
| 5,518,948 A * | 5/1996 | Walker | ............... | 438/396 |
| 5,602,051 A * | 2/1997 | Cronin et al. | ............... | 438/396 |
| 5,604,147 A * | 2/1997 | Fischer et al. | ............... | 438/396 |
| 5,668,412 A * | 9/1997 | Kim | ............... | 257/773 |
| 5,759,892 A * | 6/1998 | Wang et al. | ............... | 438/254 |
| 5,981,377 A * | 11/1999 | Koyama | ............... | 438/633 |
| 6,013,550 A * | 1/2000 | Lee et al. | ............... | 438/253 |
| 6,107,136 A * | 8/2000 | Melnick et al. | ............... | 438/253 |
| 6,114,243 A * | 9/2000 | Gupta et al. | ............... | 438/687 |
| 6,140,233 A * | 10/2000 | Kwag et al. | ............... | 438/669 |
| 6,159,851 A * | 12/2000 | Chen et al. | ............... | 438/669 |
| 6,169,024 B1 * | 1/2001 | Hussein | ............... | 438/627 |
| 6,218,283 B1 * | 4/2001 | Park et al. | ............... | 438/622 |
| 6,228,736 B1 * | 5/2001 | Lee et al. | ............... | 438/396 |
| 6,239,022 B1 * | 5/2001 | Seo et al. | ............... | 438/629 |
| 6,441,492 B1 * | 8/2002 | Cunningham | ............... | 257/762 |

(Continued)

*Primary Examiner*—Fernando L Toledo
*Assistant Examiner*—Ankush K Singal
(74) *Attorney, Agent, or Firm*—Townsend and Townsend and Crew LLP (57) ABSTRACT

A method for forming a capacitor of a semiconductor device includes forming a first insulation layer having a storage node plug on a semiconductor substrate; forming an etch stop layer and a second insulation layer sequentially on the substrate having the first insulation layer; forming a hole exposing a portion of the storage node plug by selectively etching the second insulation layer by using the etch stop layer; recessing a portion of the storage node plug exposed by the hole; forming a barrier metal layer on a surface of the recessed storage node plug; forming a storage node electrode connected to the storage node plug through the barrier metal layer in the hole; and forming a dielectric layer and a metal layer for a plate electrode sequentially on the storage node electrode.

23 Claims, 8 Drawing Sheets

U.S. PATENT DOCUMENTS

| | | | |
|---|---|---|---|
| 6,483,141 B2* | 11/2002 | Sano | 257/306 |
| 6,500,763 B2* | 12/2002 | Kim et al. | 438/689 |
| 6,511,904 B1* | 1/2003 | Chen et al. | 438/626 |
| 6,537,902 B1* | 3/2003 | Orita | 438/597 |
| 6,605,532 B1* | 8/2003 | Parekh et al. | 438/637 |
| 6,613,664 B2* | 9/2003 | Barth et al. | 438/629 |
| 6,656,784 B2* | 12/2003 | Pakr | 438/239 |
| 6,706,625 B1* | 3/2004 | Sudijono et al. | 438/637 |
| 6,730,956 B2* | 5/2004 | Bae et al. | 257/306 |
| 6,770,528 B2* | 8/2004 | Furukawa et al. | 438/244 |
| 6,852,592 B2* | 2/2005 | Lee et al. | 438/253 |
| 6,861,690 B2* | 3/2005 | Park | 257/296 |
| 6,867,096 B2* | 3/2005 | Cho et al. | 438/256 |
| 6,930,014 B2* | 8/2005 | Kim et al. | 438/396 |
| 7,008,872 B2* | 3/2006 | Dubin et al. | 438/678 |
| 7,018,919 B2* | 3/2006 | Ishikawa et al. | 438/629 |
| 7,112,506 B2* | 9/2006 | Kim et al. | 438/387 |
| 7,179,739 B2* | 2/2007 | Choi et al. | 438/656 |
| 7,180,187 B2* | 2/2007 | Fitzsimmons et al. | 257/750 |
| 7,235,452 B2* | 6/2007 | Kang et al. | 438/396 |
| 7,298,000 B2* | 11/2007 | Sandhu et al. | 257/301 |
| 7,321,146 B2* | 1/2008 | Yun et al. | 257/300 |
| 7,332,761 B2* | 2/2008 | Lee et al. | 257/296 |
| 7,372,152 B2* | 5/2008 | Cunningham | 257/751 |
| 2001/0005631 A1* | 6/2001 | Kim et al. | 438/689 |
| 2001/0030366 A1* | 10/2001 | Nakano et al. | 257/758 |
| 2002/0058379 A1* | 5/2002 | Sano | 438/253 |
| 2002/0106856 A1* | 8/2002 | Lee et al. | 438/255 |
| 2002/0117399 A1* | 8/2002 | Chen et al. | 205/125 |
| 2002/0140018 A1* | 10/2002 | Lee et al. | 257/306 |
| 2003/0054634 A1* | 3/2003 | Lee et al. | 438/675 |
| 2003/0087520 A1* | 5/2003 | Chen et al. | 438/643 |
| 2003/0122174 A1* | 7/2003 | Fukuzumi | 257/306 |
| 2003/0160331 A1* | 8/2003 | Fujisawa | 257/774 |
| 2003/0162353 A1* | 8/2003 | Park | 438/253 |
| 2003/0194872 A1* | 10/2003 | Parikh et al. | 438/694 |
| 2004/0009615 A1* | 1/2004 | Schuele et al. | 438/3 |
| 2004/0126982 A1* | 7/2004 | Park | 438/396 |
| 2004/0145057 A1* | 7/2004 | Choi | 257/758 |
| 2004/0149992 A1* | 8/2004 | Park et al. | 257/71 |
| 2004/0152295 A1* | 8/2004 | Cooney et al. | 438/623 |
| 2004/0175884 A1* | 9/2004 | Kang et al. | 438/254 |
| 2004/0253811 A1* | 12/2004 | Lee et al. | 438/633 |
| 2004/0262662 A1* | 12/2004 | Lee et al. | 257/306 |
| 2004/0262771 A1* | 12/2004 | Kohyama et al. | 257/758 |
| 2004/0266100 A1* | 12/2004 | Cho et al. | 438/253 |
| 2005/0023640 A1* | 2/2005 | Choi et al. | 257/532 |
| 2005/0032304 A1* | 2/2005 | Park et al. | 438/253 |
| 2005/0032305 A1* | 2/2005 | Kishida et al. | 438/255 |
| 2005/0095778 A1* | 5/2005 | Dong et al. | 438/238 |
| 2005/0130371 A1* | 6/2005 | Cho et al. | 438/253 |
| 2007/0059647 A1* | 3/2007 | Baik | 430/311 |
| 2007/0087498 A1* | 4/2007 | Liao et al. | 438/241 |
| 2007/0117312 A1* | 5/2007 | Nam | 438/253 |
| 2007/0241428 A1* | 10/2007 | Greenberg et al. | 257/587 |

* cited by examiner

cleaning step

METHOD FOR FABRICATING CAPACITOR OF SEMICONDUCTOR DEVICE

CROSS-REFERENCES TO RELATED APPLICATIONS

The present application claims priority to Korean Patent Application No. 10-2004-0107935, filed Dec. 17, 2004, which is incorporated by reference.

BACKGROUND OF THE INVENTION

The present invention relates to a method for fabricating a capacitor of a semiconductor device, and more particularly to a method for forming a storage node electrode of a MIM (Metal-Insulator-Metal) capacitor of a semiconductor device.

Currently, according to a method by which a contact plug for forming a general MIM stack TiN storage node electrode in a DRAM having an integration degree of 128 Megabit is formed, a bit line is formed on a substrate on which a semiconductor circuit of a transistor including a metal or silicide layer-oxide-semiconductor, etc. is formed, and an insulation layer is formed, and then a storage node contact hole is formed. The storage node contact has a lower portion including a silicon substrate, and doped silicon or silicon grown by an epitaxial method. Then, after the interior of the storage node contact is filled with polysilicon by using a chemical vapor deposition method, a storage node contact plug is manufactured by shorting it by CMP or etchback.

FIGS. 1A to 1E are process cross-sectional views for explaining a conventional method for forming a capacitor of a semiconductor device.

Figure 1A:
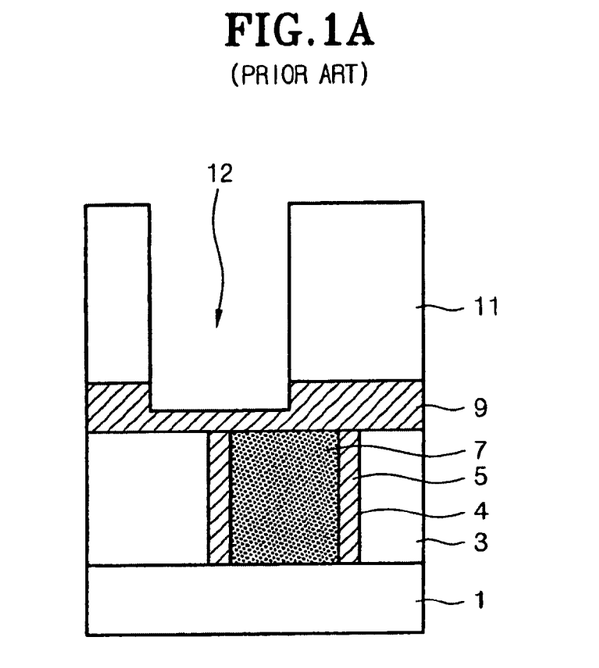
FIGS. 1A to 1E are process cross-sectional views for explaining a conventional method for forming a capacitor of a semiconductor device.

First, as shown in FIG. 1A, after a first oxide layer 3 is formed on a semiconductor substrate 1 having a gate electrode, a source/drain, etc., a storage node contact 4 exposing the source or the drain is formed by selectively etching the first oxide layer 3. A first silicon nitride layer (not shown) is deposited on the substrate having the storage node contact 4, and then a spacer 5 surrounding the inner side wall of the storage node contact 4 is formed by etching the silicon nitride layer. Thereafter, a polysilicon layer is deposited on the resulting structure, so as to fill the storage node contact 4 including the spacer 5, and then a storage node plug 7 is formed by etching the polysilicon layer. Then, after a second silicon nitride layer 9 is deposited on overall surface of the substrate including the storage node plug 7, so as to have a thickness of 500 to 1500 Å, a second oxide layer 11 is formed on the second silicon nitride layer 9, so as to have a thickness of 15000 to 30000 Å. Here, the second silicon nitride layer 9 functions as an etch stop layer in an etching step for forming a hole to be formed a storage node electrode of a capacitor, and the second oxide layer 11 functions as a sacrificial oxide layer for forming the storage node electrode.

Figure 1B:
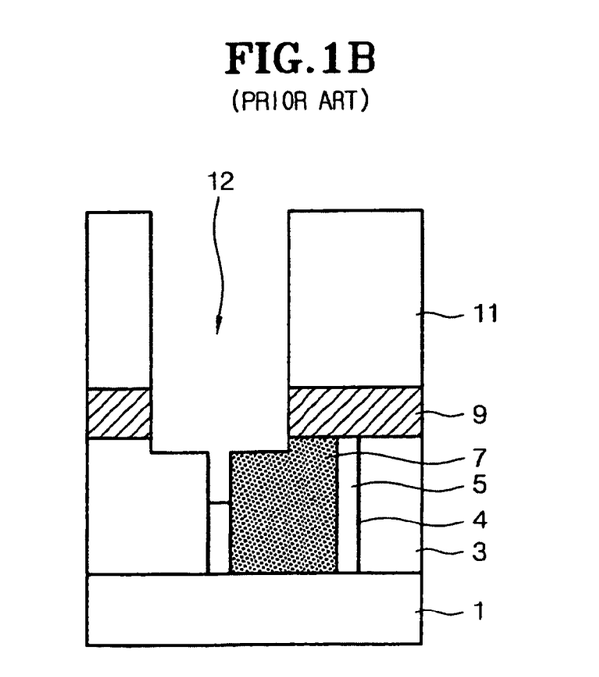

Next, as shown in FIG. 1B, after a second oxide layer is etched until the second silicon nitride layer 9 is exposed, the hole 12 is formed by selectively etching the second silicon nitride layer 9. At this time, a portion of the spacer 5 is etched in the step of etching the second silicon nitride layer.

Figure 1C:
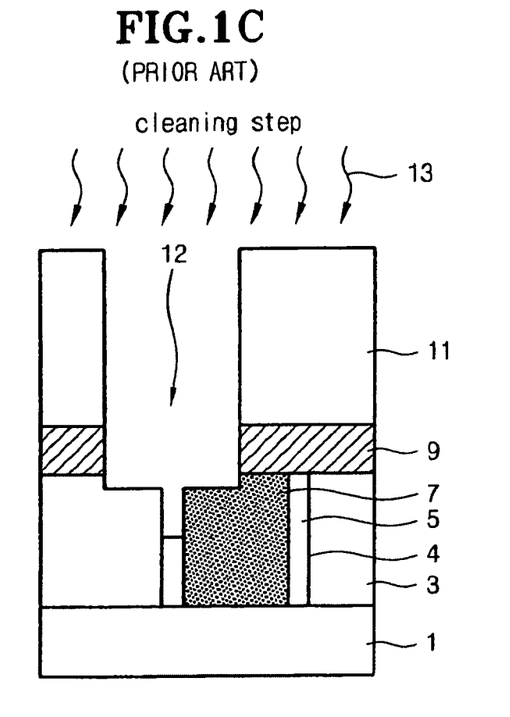

Thereafter, as shown in FIG. 1C, a cleaning step 13 is performed to the etching resultant.

FIGS. 1A to 1E are process cross-sectional views for explaining a conventional method for forming a capacitor of a semiconductor device.

First, as shown in FIG. 1A, after a first oxide layer 3 is formed on a semiconductor substrate 1 having a gate electrode, a source/drain, etc., a storage node contact 4 exposing the source or the drain is formed by selectively etching the first oxide layer 3. A first silicon nitride layer (not shown) is deposited on the substrate having the storage node contact 4, and then a spacer 5 surrounding the inner side wall of the storage node contact 4 is formed by etching the silicon nitride layer. Thereafter, a polysilicon layer is deposited on the resulting structure, so as to fill the storage node contact 4 including the spacer 5, and then a storage node plug 7 is formed by etching the polysilicon layer. Then, after a second silicon nitride layer 9 is deposited on overall surface of the substrate including the storage node plug 7, so as to have a thickness of 500 to 1500 Å, a second oxide layer 11 is formed on the second silicon nitride layer 9, so as to have a thickness of 15000 to 30000 Å. Here, the second silicon nitride layer 9 functions as an etch stop layer in an etching step for forming a hole to be formed a storage node electrode of a capacitor, and the second oxide layer 11 functions as a sacrificial oxide layer for forming the storage node electrode.

Next, as shown in FIG. 1B, after a second oxide layer is etched until the second silicon nitride layer 9 is exposed, the hole 12 is formed by selectively etching the second silicon nitride layer 9. At this time, a portion of the spacer 5 is etched in the step of etching the second silicon nitride layer.

Thereafter, as shown in FIG. 1C, a cleaning step 13 is performed to the etching resultant.

Figure 1D:
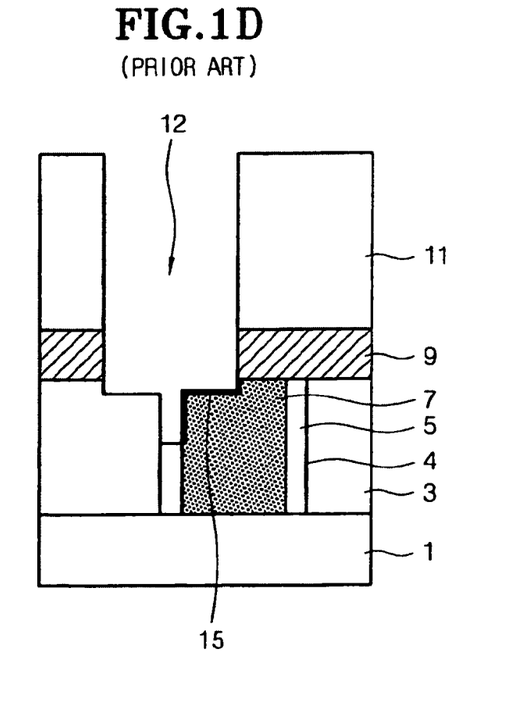

Then, as shown in FIG. 1D, after a Ti layer (not shown) is deposited on the substrate in which the cleaning step is completed by a CVD or PVD process so as to have a thickness of 50 Å, a $TiSi_x$ layer 15 is formed by proceeding an annealing step. Here, the $TiSi_x$ layer 15 is formed by the reaction of the Ti layer with silicon within the storage node plug 7. Thereafter, the Ti layer which is not reacted is removed by a wet etching step, thereby lowering the resistance of the contact surface between the storage node plug 7 and a TiN layer (not shown) for the storage node electrode to be formed thereafter.

Figure 1E:
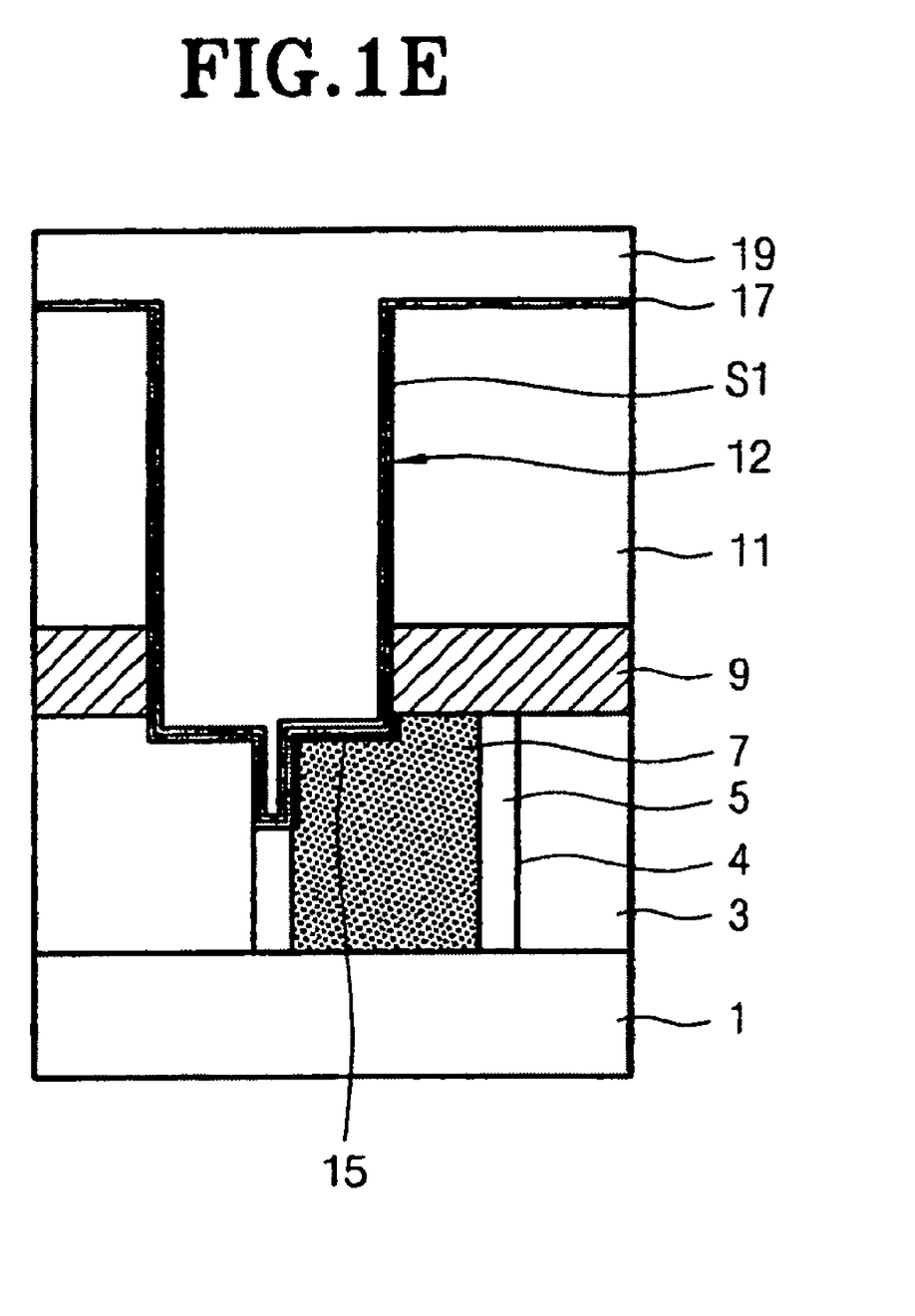

Next, as shown in FIG. 1E, the TiN layer (not shown) for the storage node electrode is deposited on the overall surface of the substrate having the $TiSi_x$ layer 15, and then a storage node electrode S1 of the capacitor electrically connected to the storage node plug 7 through the $TiSi_x$ layer 15 is formed by etchback the TiN layer. Thereafter, the manufacturing process of the capacitor is completed by sequentially forming the dielectric layer 17 and the TiN layer 19 for the plate electrode on the storage node electrode S1 of the capacitor.

Figure 2:
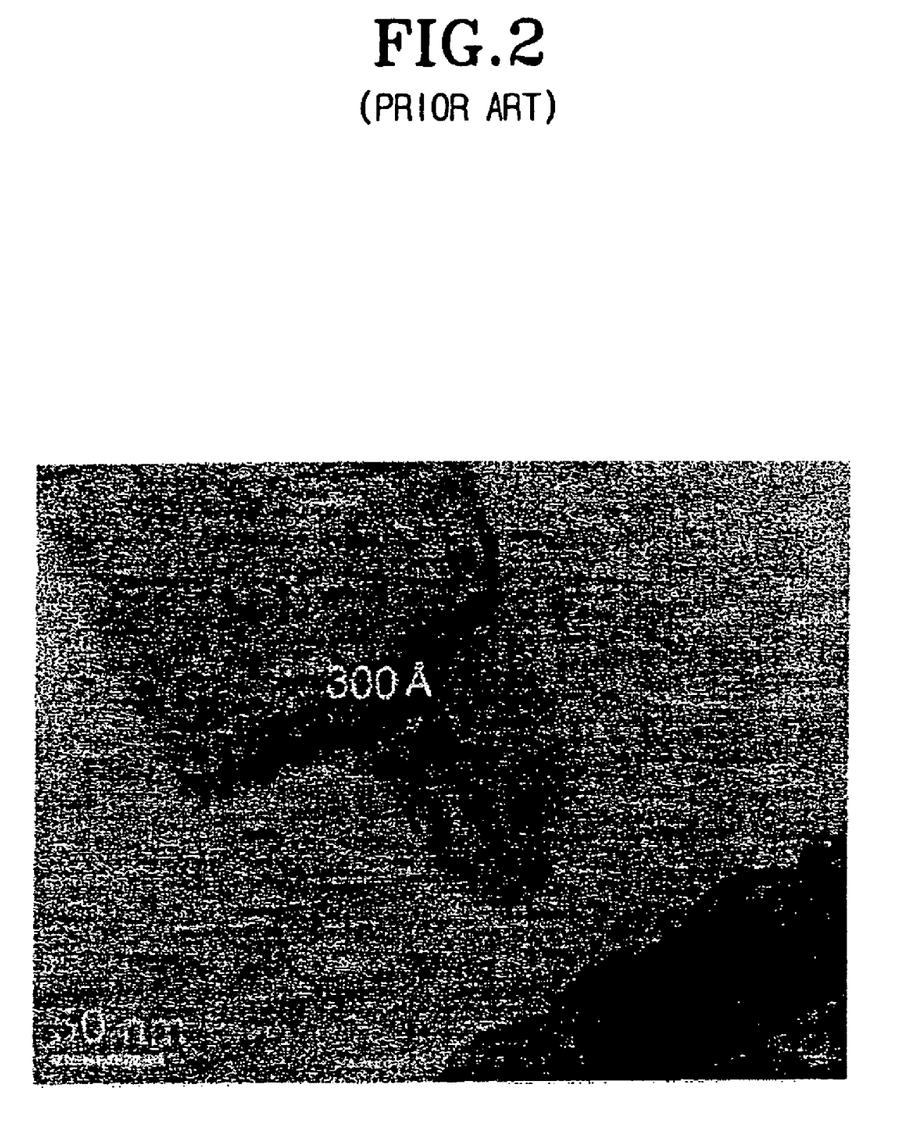
FIG. 2 is a TEM picture for explaining problems of the conventional art.

FIG. 2 is a TEM picture for explaining problems of the conventional art.

In the conventional art, during the etching step for forming the hole, as shown in FIG. 2, the spacer on the side wall of the storage node plug is attacked and thus a crevasse results. The width of the upper portion of the crevasse ranges from 300 to 400 Å. Thereafter, since the TiN layer having a thickness of 50 Å and the dielectric layer having the thickness of 50 to 100 Å is formed sequentially on the overall surface of the substrate in which the crevasse has formed, the crevasse is closed or narrowed at the time of deposition of the TiN layer for the plate electrode. Therefore, since the TiN layer for the plate electrode is not deposited properly, a cusp or a structural defect which serves as a cause of the leakage current of the capacitor is formed in the dielectric layer or the TiN layer for the plate electrode.

While testing the capacitor at a device level, the capacitor may fail due to the current leakage. If such a phenomenon occurs, the corresponding cell immediately fails, and the corresponding chip has a high possibility of failing. In the case that a polysilicon layer is applied as a material for the storage node electrode, even though the crevasse is formed, since the step coverage characteristics of the polysilicon layer is excellent, the crevasse is filled nicely. On the other hand, in case of the MIM capacitor, since a metal is applied as the material for the storage node electrode, even when depositing by the ALD method, the step coverage characteristics of the metal layer is inferior to that of the polysilicon, the crevasse generally cannot be filled as well.

BRIEF SUMMARY OF THE INVENTION

Accordingly, the present embodiments relate to forming capacitors in a semiconductor device. One embodiment of the present invention relates to a method for fabricating a capacitor of a semiconductor device, which can prevent current leakage resulting from a crevasse by an attack to a spacer on a side wall of the storage node plug during an etching step for forming a second storage node contact.

According to the present embodiment, there is provided a method for fabricating a capacitor of a semiconductor device, which includes the steps of: forming a first insulation layer having a storage node plug on a semiconductor substrate; forming an etch stop layer and a second insulation layer sequentially on the substrate having the first insulation layer; forming a hole exposing a portion of the storage node plug by selectively etching the second insulation layer by using the etch stop layer; recessing a portion of the storage node plug exposed by the hole; forming a barrier metal layer on a surface of the recessed storage node plug; forming a storage node electrode connected to the storage node plug through the barrier metal layer in the hole; and forming a dielectric layer and a metal layer for a plate electrode sequentially on the storage node electrode.

The total thickness of the etch stop layer and the second insulation layer is 6000 to 30000 Å. The etch stop layer is formed by using a material of a silicon nitride layer so as to have a thickness of 100 to 2000 Å. The second insulation layer uses one of a single oxide layer and a multi-oxide layer using a CVD process.

It is preferable that the recessing step is performed by wet etching using a chemical with an etching rate of at least 1:10 for the etch stop layer with respect to the storage node plug and for the first insulation layer with respect to the storage node plug, and the recessing step is performed by wet etching so as to remove a thickness of 100 to 1200 Å.

The recessing step is performed by wet etching using a mixed chemical which is one of $NH_4OH/H_2O$ and $HF/HNO_3$. The $NH_4OH/H_2O$ mixed chemical is made by mixing $NH_4OH$ and $H_2O$ so as to have a volume ratio of 10:1 to 1:500. The $HF/HNO_3$ mixed chemical is made by mixing HF and $HNO_3$ so as to have a volume ratio of 20:1 to 1:100. Further, in the recessing step, the temperature of a bath is maintained within 4 to 100° C. and dipping is performed for 5 to 3600 seconds.

The recessing step is performed by dry etching which removes only a silicon layer and leaves an oxide layer as it is. The dry etching is performed by using mixture gas of HBr and $Cl_2$.

The step of forming the barrier metal layer includes the steps of depositing a metal layer of one selected from the group consisting of Ti, Co, and Zr on the overall surfaces of substrate including the recessed storage node plug, and performing a heat treatment process to the substrate resultant structure so as to occur a chemical reaction between the metal layer and the storage node plug. Then, after the barrier metal layer is formed, the method further includes a step of wet-etching portions of the metal layer which are not reacted.

It is preferable that the step of forming the storage node electrode includes the steps of forming a TiN layer on the overall surface of the substrate having the barrier metal layer through one of CVD and ALD processes, and etching the TiN layer until the second insulation layer is exposed. The TiN layer has a thickness of 50 to 1000 Å. The step of etching the TiN layer is performed by using one method of etchback or CMP.

It is preferable that the dielectric layer uses a single layer of one selected from the group consisting of TaON, $Ta_2O_5$, $TiO_2$, $Al_2O_3$, $HfO_2$, HfN, $SrTiO_3$, $(Ba,Sr)TiO_3$, and $(Pb,Sr)TiO_3$ or a composite layer thereof, and is formed so as to have a thickness of 50 to 400 Å by using one of MOCVD and ALCVD processes.

It is preferable that the metal layer for the plate electrode uses a conductive layer of TiN or Ru, and is formed so as to have a thickness of 500 to 3000 Å by using one of CVD and ALD processes.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, one or more embodiments of the present invention will be described with reference to accompanying drawings.

FIGS. 3A to 3G are process cross-sectional views for explaining a method for forming a capacitor of a semiconductor device according to one embodiment of the present invention.

Figure 3A:
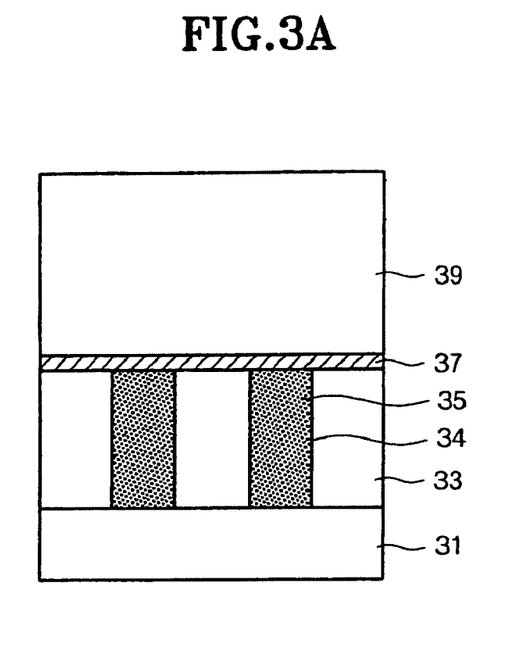
FIGS. 3A to 3G are process cross-sectional views for explaining a method for forming a capacitor of a semiconductor device according to one embodiment of the present invention.

First, as shown in FIG. 3A, after a first insulation layer 33 is formed on a semiconductor substrate 31 having a transistor (not shown) of a gate electrode, a source/drain, etc., a storage node contact 34 exposing the source or the drain is formed by selectively etching the first insulation layer. Then, a polysilicon layer (not shown) is deposited on overall surface of the substrate having the storage node contact 34 and a storage node plug 35 burying the storage node contact 34 is formed by etchback the polysilicon layer. Thereafter, a silicon nitride layer 37 and a second insulation layer 39 are sequentially formed on the overall surface of the substrate having the storage node plug 35. Then, the silicon nitride layer 37 functions as an etch stop layer in an etching step for forming a hole to be formed thereafter, and has a thickness of 100 to 2000 Å. The second insulation layer functions as a sacrificial oxide layer for forming the storage node electrode of the capacitor, and uses one of a single oxide layer or a multi-oxide layer using the CVD process. On the other hand, the total thickness of the silicon nitride layer 37 and the second insulation layer 39 is 6000 to 30000 Å.

Figure 3B:
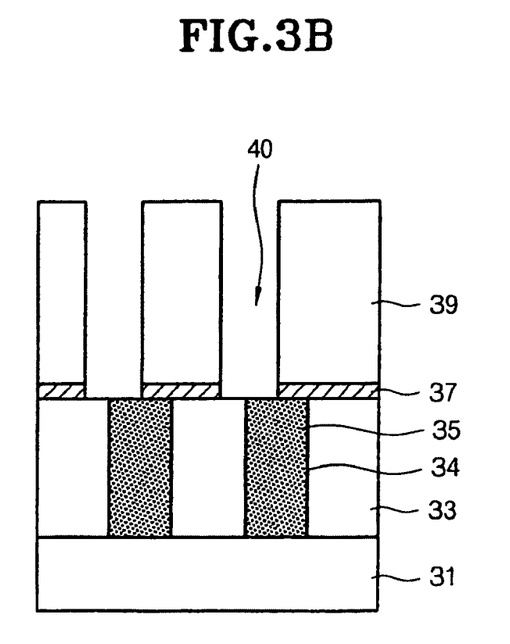

Next, as shown in FIG. 3B, the hole 40 exposing a portion of the storage node plug 35 is formed by using the silicon nitride layer 37 as an etch stop layer and selectively etching the second insulation layer 39.

Figure 3C:
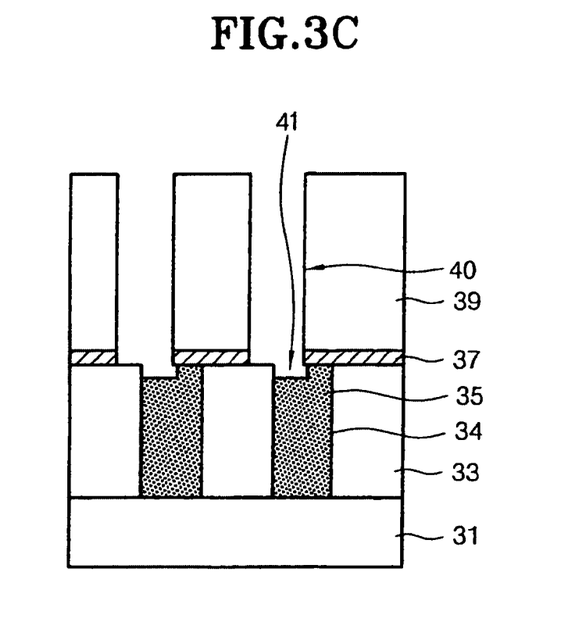

Thereafter, as shown in FIG. 3C, the storage node plug 35 exposed by the hole 40 is recessed (refer to the reference numeral 41) so as to remove a thickness of 100 to 1200 Å. At this time, the recessing step is proceeded by using the wet etching method, and the temperature of a bath is maintained within 4 to 100° C., and dipping is performed for 5 to 3600 seconds. The recessing step is performed by wet etching using a chemical with an etching rate of at least 1:10 for the silicon nitride layer with respect to silicon of the storage node plug and for the first insulation layer with respect to the silicon component of the storage node plug.

The wet chemical uses one of $NH_4OH/H_2O$ and $HF/HNO_3$. Then, in the case that the $NH_4OH/H_2O$ mixed chemical is used as the wet chemical, it is made by mixing $NH_4OH$ and $H_2O$ so as to have a volume ratio of 10:1 to 1:500. Further, in the case that the $HF/HNO_3$ mixed chemical is used as the wet chemical, it is made by mixing HF and $HNO_3$ so as to have a volume ratio of 20:1 to 1:100.

The recessing step can be performed also by using dry etching. In the case, the recessing step is performed using a gas mixture of HBr and $Cl_2$, only the silicon layer is removed, leaving the oxide layer as it is.

According to the present embodiment, the process recipe includes adding only one chemical to a sequence in a cleaning equipment before the formation of a barrier metal layer, i.e., <HF dipping step→DiW (DeIonized Water) rinsing step→drying step> and by applying <processing one mixed chemical of $NH_4OH/H_2O$ and $HF/HNO_3$→DIW rinsing step→HF dipping step→DIW rinsing step→drying step>. Therefore, as one of the recipes used with the one cleaning equipment, the recessing step of the storage node plug is performed together with the cleaning step before the formation of the barrier metal layer.

Figure 3D:
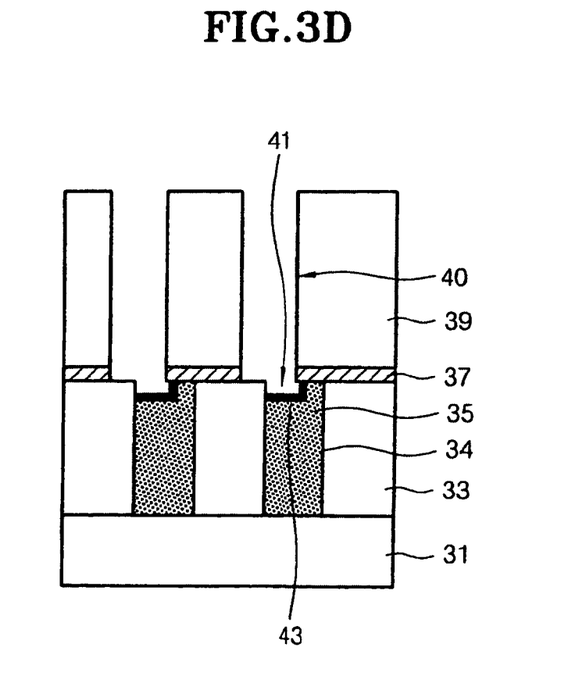

Thereafter, as shown in FIG. 3D, a barrier metal layer 43 is formed on the surface of the recessed storage node plug 35. Here, according to the barrier forming step, the barrier metal layer is formed on the surface of the recessed storage node plug by depositing a metal layer (not shown) of one of Ti, Co, and Zr on the overall surface of the recessed substrate and then by performing heat treatment process to the substrate resultant structure, so as to cause the chemical reaction between the metal layer and the storage node plug. Then, after barrier metal layer is formed, the metal layer which is not reacted is removed by wet etching.

Figure 3E:
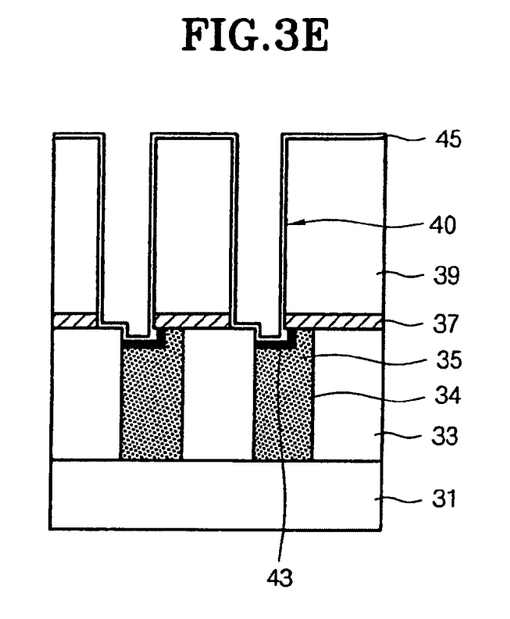

Next, as shown in FIG. 3E, the TiN layer 45 is formed on the overall surface including the barrier metal layer 43 through one of CVD and ALD processes, so as to have a thickness of 50 to 1000 Å.

Figure 3F:
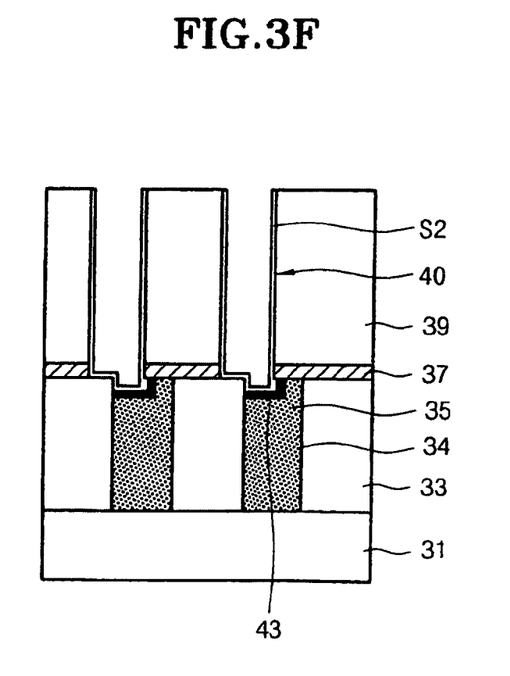

Thereafter, as shown in FIG. 3F, a storage node electrode S2 connected to the storage node plug 35 through the barrier metal layer 43 is formed in the interior of the hole 40 by etching the TiN layer until the second insulation layer 39 is exposed. Here, the step of etching the TiN layer uses one method of etchback and CMP.

Figure 3G:
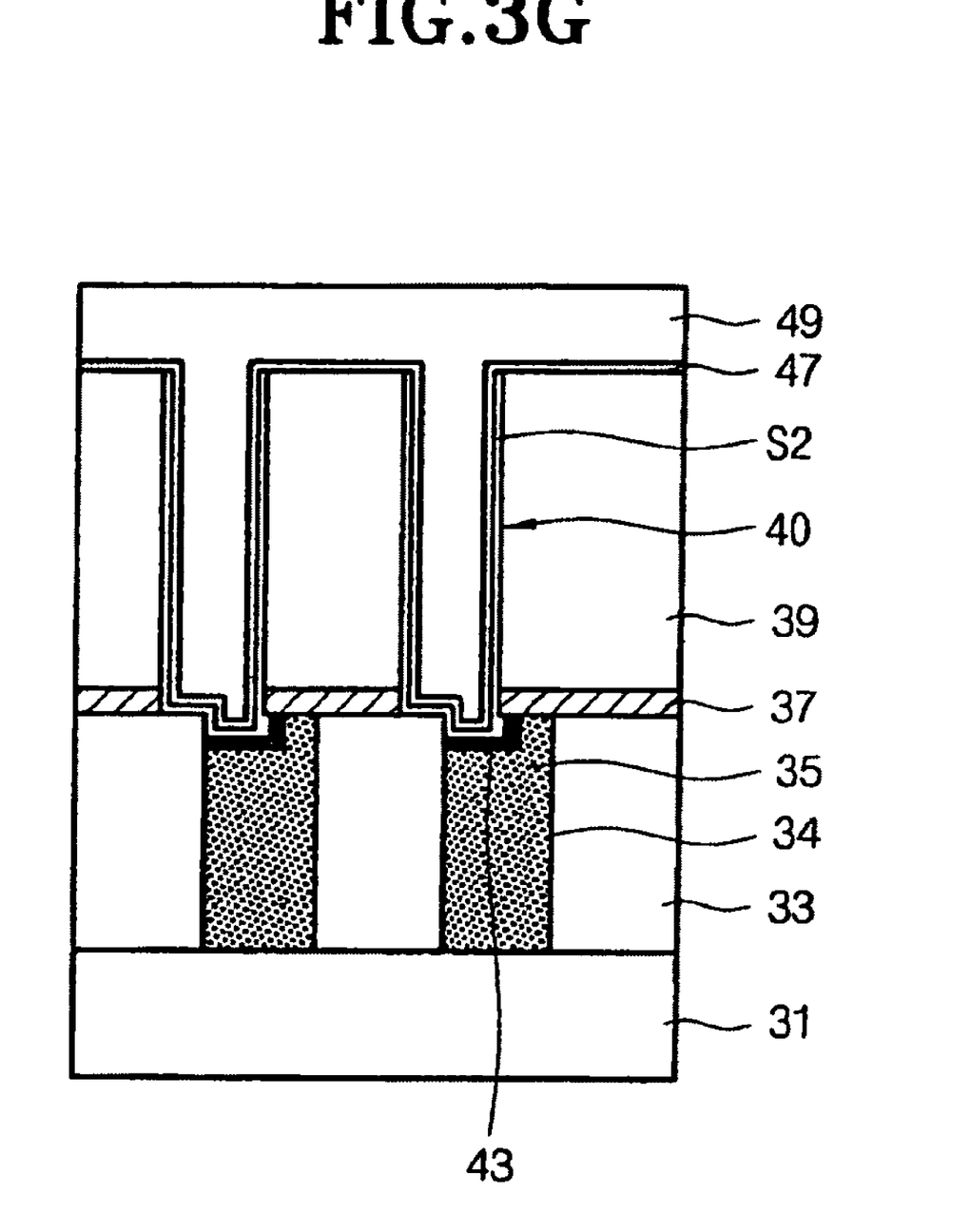

Thereafter, as shown in FIG. 3G, manufacturing the capacitor is completed by sequentially forming a dielectric layer 47 and a metal layer 49 for the plate electrode on the storage node electrode S2. Here, the dielectric layer 47 is formed so as to have a thickness of 50 to 400 Å by using one of MOCVD and ALCVD processes. The dielectric layer 47 uses a single layer of one selected from TaON, $Ta_2O_5$, $TiO_2$, $Al_2O_3$, $HfO_2$, HfN, Sr $TiO_3$, $(Ba,Sr)TiO_3$, and $(Pb,Sr)TiO_3$ or a composite layer thereof. Further, the metal layer 49 for the plate electrode is formed so as to have a thickness of 500 to 3000 Å by using one of CVD and ALD processes, and uses a conductive layer of TiN or Ru.

According to the present embodiment, the storage node plug can be protected by recessing the storage node plug exposed by the hole and then forming the barrier metal layer. As a result, the leakage current source can be effectively removed.

Namely, according to the present embodiments, during the etching step for forming the hole, the leakage current source generated by the crevasse form by attack on the spacer of the side wall of the storage node plug is effectively removed. Therefore, a stable device can be manufactured and the yield rate of the wafer can be increased by eliminating one of the causes of the wafer yield reduction.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method for fabricating a capacitor of a semiconductor device, the method comprising the steps of:
    forming a first insulation layer having a storage node plug over a semiconductor substrate, the storage node plug having a top surface;
    forming an etch stop layer and a second insulation layer sequentially over an upper surface of the first insulation layer including the top surface of the storage node plug;
    forming a hole exposing less than the entire top surface of the storage node plug and exposing less than the entire upper surface of the first insulation layer by selectively etching the second insulation layer using the etch stop layer;
    recessing a portion of the storage node plug exposed by the hole to form a recessed portion of the storage node plug, the first insulating layer that is exposed by the hole being unaffected by the formation of the recessed portion of the storage node plug such that an integrity of the first insulating layer is maintained, wherein the recessed portion of the storage node plug is provided adjacent to the exposed first insulation layer and a non-recessed portion of the storage node plug;
    forming a barrier metal layer on a surface of the recessed portion of the storage node plug;
    forming a storage node electrode connected to the storage node plug through the barrier metal layer in the hole, wherein the storage node electrode is formed over the exposed first insulating layer; and
    forming a dielectric layer and a metal layer for a plate electrode sequentially on the storage node electrode.

2. A method according to claim 1, wherein a total thickness of the etch stop layer and the second insulation layer is 6000 to 30000 Å.

3. A method according to claim 1, wherein the etch stop layer is formed by using a material of a silicon nitride layer, the etch stop layer having a thickness of 100 to 2000 Å.

4. A method according to claim 1, wherein the second insulation layer uses one of a single oxide layer and a multi-oxide layer, the second insulation layer being formed using a CVD process.

5. A method according to claim 1, wherein the recessing step is performed by wet etching using a chemical with an etching rate of at least 1:10 for the etch stop layer with respect to the storage node plug and for the first insulation layer with respect to the storage node plug.

6. A method according to claim 1, wherein the recessing step is performed by wet etching so as to remove a thickness of 100 to 1200 Å.

7. A method according to claim 1, wherein the recessing step is performed by wet etching using a mixed chemical selected from one of $NH_4OH/H_2O$ and $HF/HNO_3$.

8. A method according to claim 1, wherein in the recessing step, a temperature of a bath is maintained within 4 to 100° C. and dipping is performed for 5 to 3600 seconds.

9. A method according to claim 1, wherein the recessing step is performed by a dry etching which removes only a silicon layer and leaves an oxide layer as it is.

10. A method according to claim 1, wherein the step of forming the barrier metal layer comprises the steps of depositing a metal layer of one selected from the group consisting of Ti, Co, and Zr on the overall surfaces of substrate including the recessed portion of the storage node plug, and performing a heat treatment process to the substrate resultant structure so as to cause a chemical reaction between the metal layer and the recessed portion of the storage node plug.

11. A method according to claim 1, wherein the step of forming the storage node electrode comprises:

forming a TiN layer over the overall surface of the substrate having the barrier metal layer through one of CVD and ALD processes; and etching the TiN layer until the second insulation layer is exposed.

12. A method according to claim 1, wherein the dielectric layer is formed using a single layer of one selected from the group consisting of TaON, $Ta_2O_5$, $TiO_2$, $Al_3O_3$, $HfO_2$, HfN, $SrTiO_3$, $(Ba,Sr)TiO_3$, and $(Pb,Sr)TiO_3$ or a composite layer thereof.

13. A method according to claim 1, wherein the metal layer for the plate electrode is formed using a conductive layer of TiN or Ru.

14. A method according to claim 1, wherein the storage node plug consists of polysilicon.

15. A method according to claim 1, wherein the storage node electrode is formed on a surface of the second insulation layer within the hole.

16. A method according to claim 7, wherein the $NH_4OH/H_2O$ mixed chemical is made by mixing $NH_4OH$ and $H_2O$ so as to have a volume ratio of 10:1 to 1:500.

17. A method according to claim 16, wherein the $HF/HNO_3$ mixed chemical is made by mixing HF and $HNO_3$ so as to have a volume ratio of 20:1 to 1:100.

18. A method according to claim 9, wherein the dry etching is performed by using a gas mixture comprising HBr and $Cl_2$.

19. A method according to claim 10, further comprising: after the barrier metal layer has been formed, wet-etching portions of the metal layer that have not reacted.

20. A method according to claim 11, wherein the TiN layer has a thickness of 50 to 1000 Å.

21. A method according to claim 11, wherein the step of etching the TiN layer is performed by using an etchback or CMP process.

22. A method according to claim 12, wherein the dielectric layer is formed so as to have a thickness of 50 to 400 Å by using one of MOCVD and ALCVD processes.

23. A method according to claim 13, wherein the metal layer for the plate electrode is formed so as to have a thickness of 500 to 3000 Å by using one of CVD and ALD processes.

* * * * *